US005485131A

United States Patent [19]

[11] Patent Number: 5,485,131

[45] Date of Patent: Jan. 16, 1996

Fajen et al.

[54] TRANSMISSION LINE FILTER FOR MIC AND MMIC APPLICATIONS

[75] Inventors: Lyle A. Fajen; Michael Dydyk, both of Scottsdale, Ariz.

[73] Assignee: Motorola, Inc., Schaumburg, Ill.

[21] Appl. No.: 322,663

[22] Filed: Oct. 13, 1994

[51] Int. Cl.[6] .................... H03H 7/00; H01P 1/20

[52] U.S. Cl. .................... 333/202; 333/204

[58] Field of Search .................... 333/202, 203, 333/204, 12, 33, 112, 118, 126, 129, 132, 134, 167, 174, 175, 185, 205

[56] References Cited

U.S. PATENT DOCUMENTS

| | | | |
|---|---|---|---|
| 5,065,117 | 11/1991 | Yoshimasu | 333/33 |
| 5,124,674 | 6/1992 | Dydyk et al. | 333/110 |
| 5,202,651 | 4/1993 | Yoshimasu | 333/170 |

FOREIGN PATENT DOCUMENTS

| | | | |
|---|---|---|---|
| 312707 | 12/1988 | Japan | 333/175 |

OTHER PUBLICATIONS

An article entitled "Microwave Integrated Circuit Filter and Schiffman Line Design", by P. F. Worcester, Naval Electronics Laboratory Center, San Diego, Calif. 92152, Oct. 30, 1972, pp. 1–65.

An article entitled "New design techniques for coupled–line filters with transmission zeros" by R. R. Bonetti and A. E. Williams, COMSAT Laboratories, Clarksburg, Md. 20871, 23rd/European Microwave Conference Proceedings 1993, vol. 1, pp. 240–243.

*Primary Examiner*—Benny Lee
*Assistant Examiner*—David Vu
*Attorney, Agent, or Firm*—Jeffrey D. Nehr

[57] ABSTRACT

A transmission line filter includes first and second substantially parallel transmission lines (20, 30), with alternate ends grounded and each transmission line (20, 30) coupled through a separate capacitor (50, 60) to electrical ground. A coupling capacitor (70) connects the first and second transmission lines (20, 30). A RF output (40) coupled to the second transmission line (30) outputs a filtered RF signal in response to a RF signal input to a RF input (10) on the first transmission line (20). MIC and MMIC applications using series capacitance to allow for line length to be reduced include versions of a band pass filter (FIGS. 5, 6), band stop filter (FIG. 7), and low pass filter (FIG. 9).

20 Claims, 4 Drawing Sheets

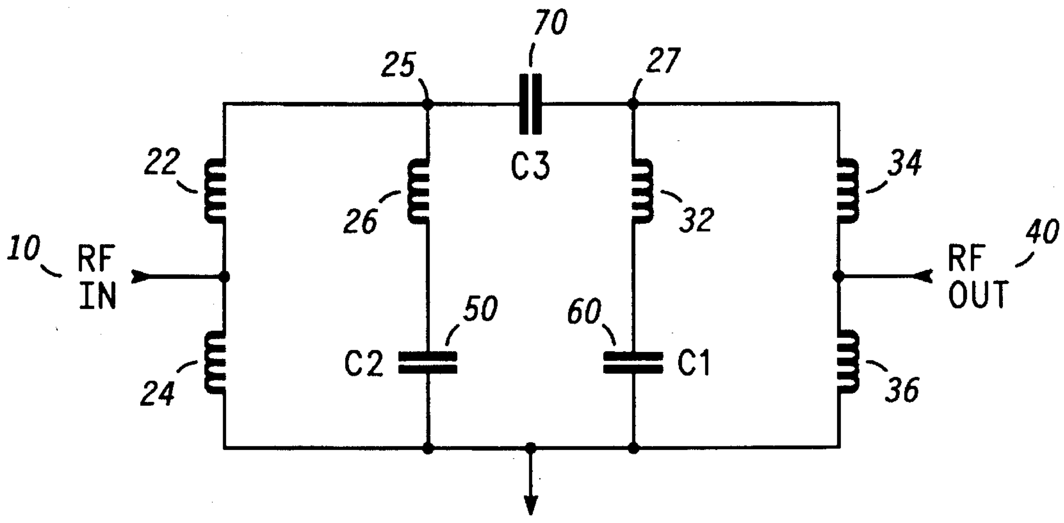
FIG. 4
FIG. 5
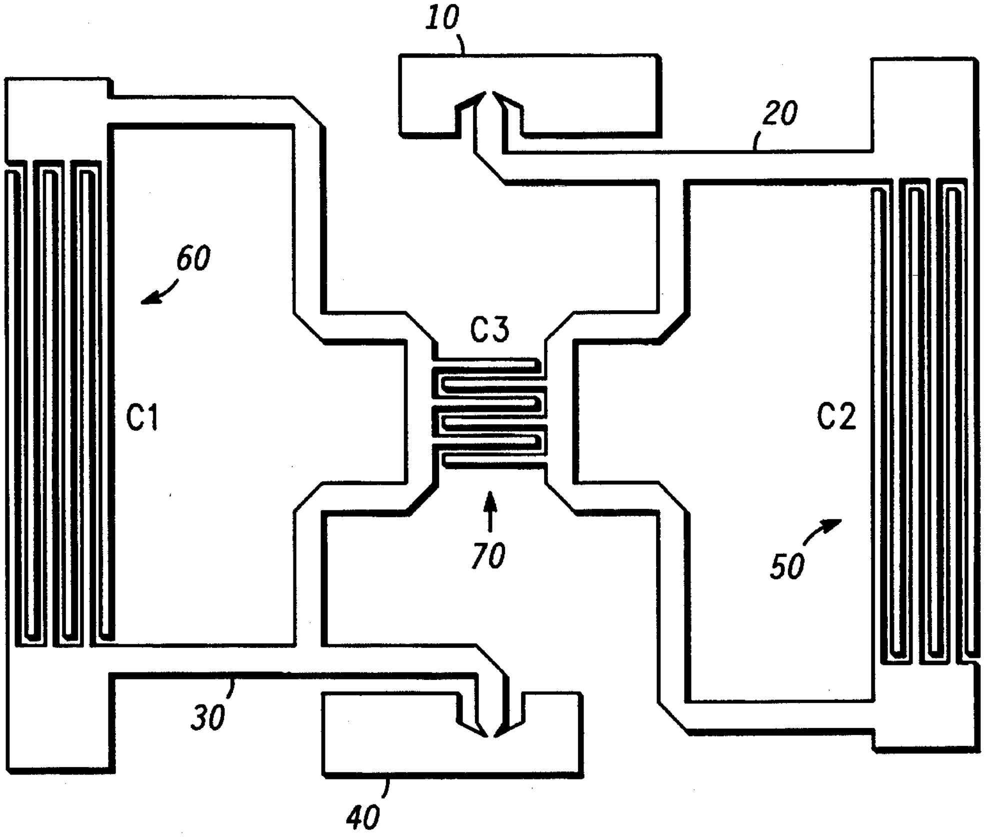

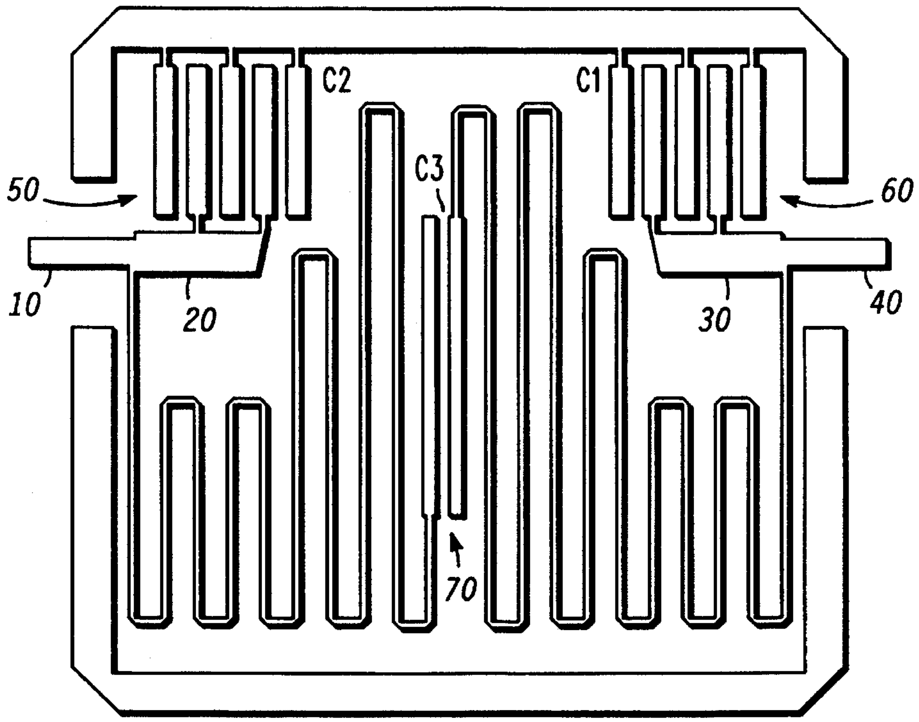
FIG. 6
FIG. 7
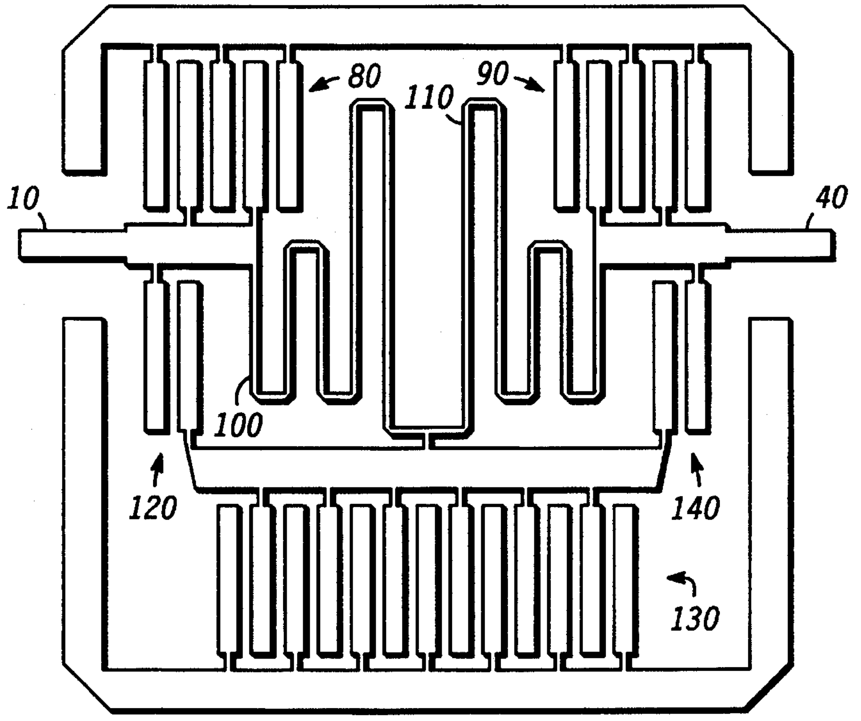

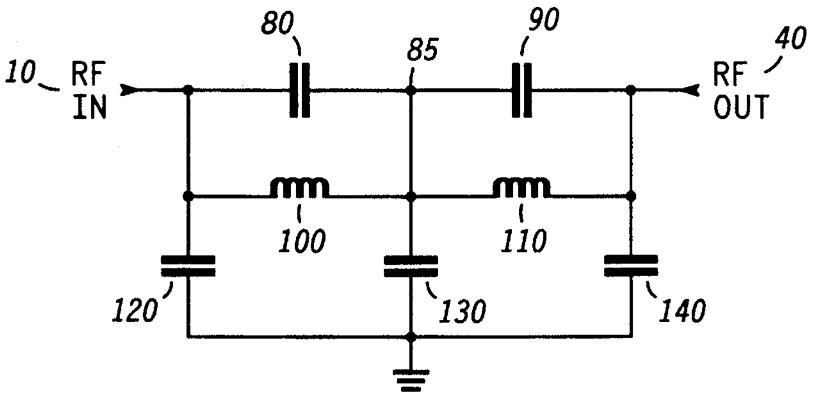
FIG. 8
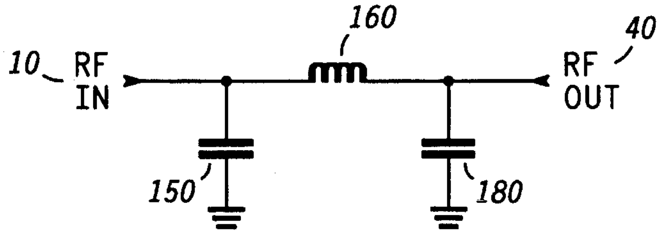
FIG. 10
FIG. 9
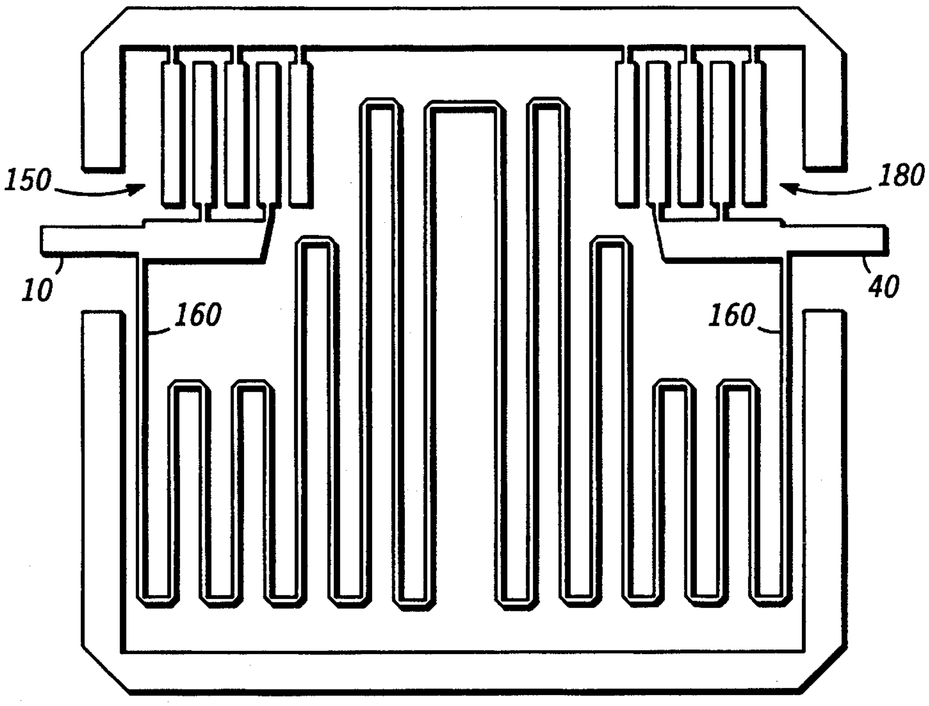

TRANSMISSION LINE FILTER FOR MIC AND MMIC APPLICATIONS

FIELD OF THE INVENTION

This invention relates in general to microwave integrated circuits (MICs) and monolithic microwave integrated circuits (MMICs), and more particularly to transmission line filters to provide bandpass, low-pass, high-pass, and band-stop frequency discrimination in such circuits.

BACKGROUND OF THE INVENTION

Microwave Integrated Circuits (MICs) and Monolithic Microwave Integrated Circuits (MMICs) are the basis for low cost, high volume consumer electronics which operate below 3.0 GHz.

Filter components for these circuits are disproportionately large because the filter inductors necessary for their operation become exponentially larger with decreasing operating frequency. Large filter inductors severely reduce the cost advantages derived from using MICs and MMICs, however.

The need exists for compact, low cost filters to provide specific band-pass, low-pass, high-pass and band-stop frequency discrimination characteristics in radio frequency (RF) and microwave transmitters and receivers. In particular, when monolithic microwave integrated circuit (MMIC) circuits are selected to fulfill low cost, high manufacturing volume requirements, such filters must be integrated to maintain low cost. When conventional filters are translated into MMIC technology, however, they consume a disproportionate amount of substrate area, raising the cost per unit of high manufacturing volume circuits (especially when the operating frequencies are relatively low, e.g. less than 3.0 GHz).

It would be desirable to provide a method and apparatus to substantially reduce the area requirements for a typical filter on MMIC substrates, preferably by as much as a factor of five. It would be desirable if such a method and apparatus were applicable to MIC filters with similar size reduction results.

BRIEF DESCRIPTION OF THE DRAWINGS

In FIG. 4, there is shown a lumped element circuit equivalent of the shortened coupled line band pass filter of FIG. 3;

In FIG. 5, there is shown a schematic and practical layout of a ceramic MIC low loss band pass filter in accordance with a preferred embodiment of the present invention;

In FIG. 6, there is shown a coplanar wave guide band pass filter in accordance with a preferred embodiment of the present invention;

In FIG. 7, there is shown a coplanar wave guide band stop filter in accordance with a preferred embodiment of the present invention;

In FIG. 8, there is shown an equivalent circuit representation of the coplanar wave guide band stop filter of FIG. 7;

In FIG. 9, there is shown a coplanar wave guide low pass filter in accordance with a preferred embodiment of the present invention; and In FIG. 10, there is shown an equivalent circuit representation of the coplanar wave guide low pass filter of FIG. 9.

DETAILED DESCRIPTION OF THE DRAWINGS

While the transmission line filters for MIC and MMIC applications discussed are particularly suited for the application described below, other applications for the transmission line filters will be readily apparent to those of skill in the art. Throughout the description below, like elements are labeled with consistent reference numbers.

Figure 1:
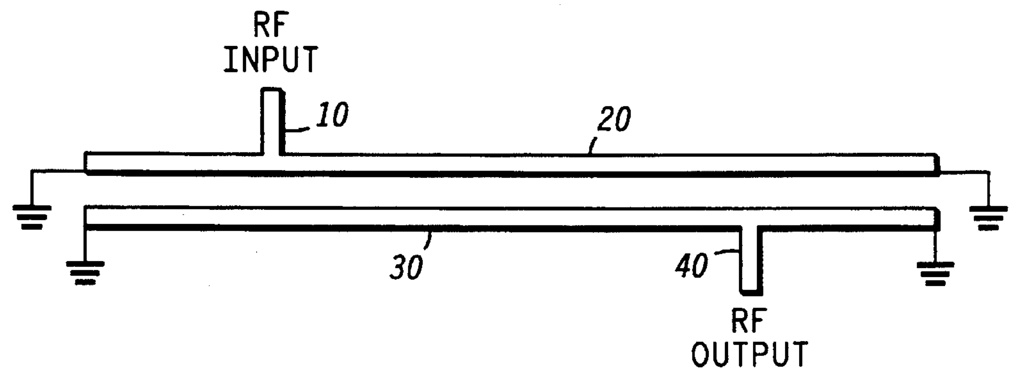
In FIG. 1, there is shown a circuit schematic of a coupled line band pass filter which is prior art.

The present invention can be more fully understood with reference to the figures. In FIG. 1, there is shown a circuit schematic of a coupled line band pass filter which is prior art. The two half-wavelength transmission lines 20 and 30 are grounded at each end and optimally coupled by adjusting their length and spacing to exhibit a particular band pass filter response. Multiple sections of this type of filter provide wider band pass and progressively more band stop attenuation. Input and output matching is accomplished by setting the input and output tap points on the input and output lines. RF input 10, providing an RF input signal, is coupled to transmission line 20; RF output 40, from which a filtered output signal emanates, is coupled from transmission line 30. The disadvantages of this configuration are: the line lengths are too long and the line spacing between sections are critical for many practical MIC or MMIC applications.

Figure 2:
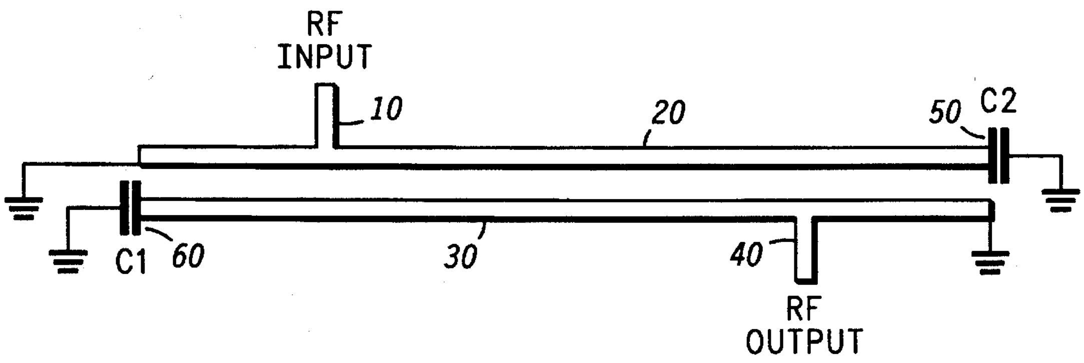
In FIG. 2, there is shown a circuit schematic of an iterative development toward the shortened coupled line band pass filter in accordance with a preferred embodiment of the present invention.

A shortened coupled line filter configuration, an iterative development toward a preferred embodiment of the invention, is shown in FIG. 2. The variation from the configuration of FIG. 1 is the addition of capacitors 50 and 60 (C1 and C2, respectively) placed in series with each of transmission lines 20 and 30, at opposite ends. Capacitors 50 and 60 shorten the transmission lines 20 and 30 to less than 10% of their original half wavelength, but the coupling between the transmission lines 20 and 30 is proportionately reduced as the lengths of transmission lines 20 and 30 are shortened. If the transmission lines 20 and 30 are shortened too extensively, the spacing between the transmission lines 20 and 30 must be decreased to an impractical photo-lithographic value. Insufficient coupling between the transmission lines 20 and 30 can cause bandwidth reduction and signal transfer loss. By selection of the shortened transmission line length for anti-resonance at undesired harmonics, harmonic frequency response of the filter is reduced by tens of decibels, when compared with the standard half wavelength transmission line filter.

Transmission line length (L) and capacitor values (C) may be calculated as follows: consider a classical representation of a resonator comprising the length L of transmission line shorted on one end and loaded with a lumped element capacitor (C). The total impedance looking left and right with respect to a reference between the capacitor and the shorted length of transmission line has to be zero. Thus, $1/j\omega C+jZ_o \tan\theta=0$, where $Z_o$ is the characteristic impedance of transmission lines 20 or 30, C is the capacitive loading 50 or 60, and $\omega$ is the operating angular frequency. Thus, we have $C=1/\omega(Z_o \tan\theta)$. Solving for $\theta$ results in $\theta=\tan^{-1}(1/\omega CZ_o)$. In terms of the wavelength of the signal $\lambda_g$ and the waveguide or transmission line 20 or 30 length L, we have $\theta=2\pi L/\lambda_g=\tan^{-1}(1/\omega CZ_o)$. Thus, $L=\lambda_g/2\pi(\tan^{-1}(1/\omega CZ_o))$.

Figure 3:
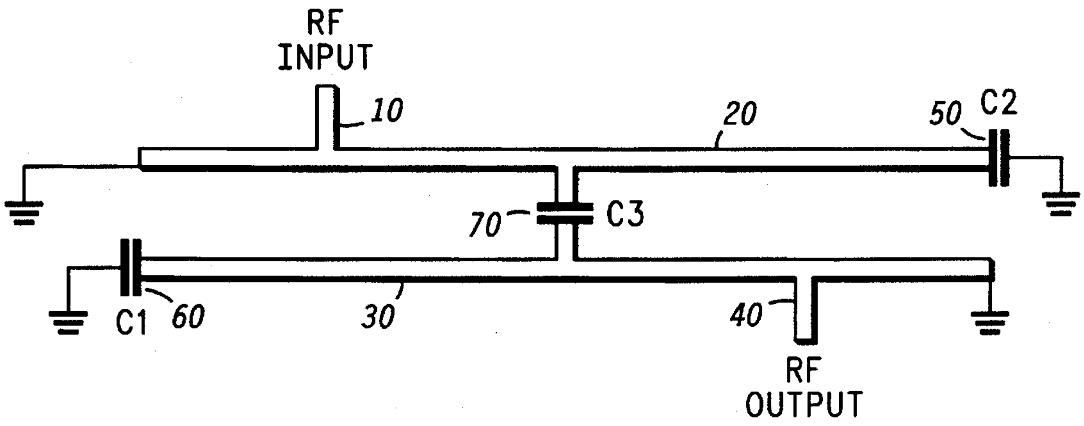
In FIG. 3, there is shown a circuit schematic of a shortened coupled line band pass filter incorporating features enabling practical MMIC fabrication.

FIG. 3 includes the addition of a third capacitor (C3) which is used to optimize the coupling between the transmission lines 20 and 30 without regard to the resonator transmission line lengths. The addition of capacitor 70 (C3) does not restrain the line length or spacing between the coupled transmission lines 20 and 30. In this design, the capacitance values are optimized with respect to the associated transmission line length (L) and width (W) dimensions. Such optimization provides electrical performance of minimum insertion loss with desired stop band attenuation and bandwidth performance, within a minimum, constrained layout area.

To design L physically small at low microwave frequencies, the physical size and electrical value of C1 and C2 must be considered. C1 and C2 must be limited, accurately controlled, and not affected by variables such as metalization etch and dielectric changes. There is a physical/electrical L–C value trade-off required to minimize layout area and maximize filter performance. For a preferred embodiment in accordance with the present invention, interdigitated, planar capacitors were selected. Such capacitors can be fabricated directly on a MIC ceramic or a MMIC gallium arsenide (GaAs) substrate, taking advantage of precision etched edge coupled fingers to obtain precisely accurate center frequency and band-pass electrical performance. A MIC interdigitated capacitor can be used and comprises an approximately 0.127 mm (5 mil) metalization width and 0.127 mm (5 mil) metalization gap. A MMIC interdigitated capacitor uses 5 micron metalization width and 5 micron metalization gap. A nominal capacitance value of up to ten picofarads (pF) is practical and fulfills the requirements for typical 800 MHz band pass filters described in this disclosure. By using 5 micron MMIC technology for example, a 12.7 mm×12.7 mm (0.5 inches×0.5 inches) MIC 800 MHz filter layout area can be reduced by a factor of 35, to less than approximately 0.1534 mm (0.06 inches)×0.3068 mm (0.12 inches).

Design and fabrication precision can be established by using precision etch or deposit of metalization to establish coplanar wave guide (transmission lines) 20 and 30. Precision etch or deposit of metalization is also used to establish edge-to- edge coupled digital capacitors for tuning the shortened input and output filter resonators (transmission lines). The same precision etched or deposited metalization is used to establish edge-to-edge coupled digital capacitors for coupling between any lines 20 and 30 which must be coupled. Precision etching and deposit of metalization is the normal manufacturing technique for the MMIC process. MMICs are of tiny size, and design freedom is gained in terms of shortened circuit interconnections that reduce performance robbing parasitics. Conventional microstrip filters use resonator line lengths equal to one half wavelength and input to output coupling is very critical in terms of line to line spacing. With the use of a capacitor inserted in series with the one half wavelength resonator lines 20 and 30, the length of the lines 20 and 30 is reduced when the lines 20 and 30 and series capacitor are in resonance. These shortened line filters are reduced in size, but, their line-to-line coupling requirements become more critical and difficult to characterize or adjust. In addition, the capacitors which resonate with the shorter lines 20 and 30 have difficult precision requirements similar to the filter's center or band-stop frequency specification.

In FIG. 4, there is shown a lumped element circuit equivalent of the shortened coupled line band pass filter of FIG. 3. RF input 10 is coupled through inductor 22 to node 25. A series combination of capacitor 50 (C2) and inductor 26 is coupled between node 25 and electrical ground. Inductor 24 is coupled between RF input 10 and electrical ground. RF output 40 is coupled through inductor 34 from node 27. A series combination of capacitor 60 (C1) and inductor 32 is coupled between node 27 and electrical ground. Inductor 36 is coupled between RF output 40 and electrical ground. Capacitor 70 (C3) is coupled between node 25 and node 27. Representative values for the components of the circuit are: inductors 24 and 36—1.8 nanohenries (nH); inductors 22 and 34—2.7 nH; inductors 26 and 32—4.2 nH; capacitors 50 and 60—4.6 pF; and capacitor 70—0.5 pF.

To describe the operation of the band-pass filter in particular, and the general operating principals of the filters below, refer to FIG. 4. Inductors 22, 24, and 26 and capacitor 50 comprise a series resonant circuit at the desired center frequency of one pole of this two pole filter structure. The length of inductors 22, 24, and 26 is shorter than the total length of a conventional quarter wavelength transmission line because capacitor 50 causes resonance with only about 0.04 wave length of transmission line (about 16% of the normally required transmission line length for a conventional quarter wave length transmission line filter). As a result, filter losses are substantially less. Inductors 32, 34, and 36 and capacitor 60 are the symmetric equivalent to inductors 22, 24, and 26 and capacitor 50. Capacitor 70 is used to couple energy from one resonant pole on the left to the second resonant pole on the right in FIG. 4.

In FIG. 4, a RF signal is applied to the RF input 10. The ratio of the inductance of inductor 24 to that of inductor 22 and inductor 26 determine the input impedance of the structure (usually 50 ohms), considering the loading effect of capacitor 50 and resonance of inductors 32, 34, and 36 and capacitor 60 matching the RF output load. A RF output signal is extracted at RF output 40. The ratio of the inductance of inductor 36 to that of inductor 34 and inductor 32 determine the output impedance of the structure. Capacitor 70 determines the bandwidth and insertion loss performance of the filter. If the capacitance of capacitor 70 is too small, insertion loss increases. If the capacitance of capacitor 70 is too large, the voltage standing wave ratio (VSWR) deteriorates at center frequency and the operating bandwidth increases beyond the design nominal. The individual series resonant circuits affect filter stop-band performance, independent of the normal two pole filter response. Inductors 22 and 34, when replaced with transmission lines of optimal length, are anti-resonant at stop-band frequencies. Optimization of these transmission line elements provide additional performance enhancement. To enhance stop-band performance with the line length variation, the ratio of the inductances of inductors 26 and 32 to that of inductors 22 and 34 can be adjusted by changing the capacitance of capacitor 70.

In FIG. 5, there is shown a schematic and practical layout of a ceramic MIC low loss band pass filter implementation in accordance with a preferred embodiment of the present invention. FIG. 5 represents a particular implementation of the FIG. 3 circuit in a basic rectangular layout, with interdigitated capacitors 50, 60, and 70. Each transmission line 20 and 30 has a "U" shaped projection from which interdigitated portions form interdigitated capacitor 70, centered between interdigitated capacitors 60 and 50 at two sides of the rectangle. RF input 10 and RF output 40 connect to transmission lines 20 and 30, respectively, opposite each other at the remaining two sides of the rectangle.

In FIG. 6, there is shown a similar coplanar wave guide band pass filter in accordance with a preferred embodiment of the present invention. The layout is also basically rectangular, with a perimeter coplanar grounding strip defining the rectangular outline, and with capacitor 70 centered between RF input 10 and RF output 40 which protrude through gaps in opposite sides of the rectangular coplanar ground outline. Capacitors 50 and 60 are interdigitated capacitors adjacent to RF input 10 and RF output 40, respectively. Transmission lines 20 and 30 are serpentined, terminating in ends which form parallel strips comprising capacitor 70.

In FIG. 7, there is shown a coplanar wave guide band stop filter in accordance with a preferred embodiment of the present invention. The layout is also basically rectangular, with a perimeter ground strip defining the rectangular outline and RF input 10 and RF output 40 protruding through gaps in opposite sides of the rectangular ground outline. Capacitors 80 and 90 are interdigitated capacitors adjacent to RF input 10 and RF output 40, respectively. Additional capacitors 120 and 140 are coupled to the RF input 10 and RF output 40, respectively, opposite capacitors 80 and 90 and through another interdigitated capacitor 130 to the perimeter strip (ground). Transmission lines 100 and 110 are serpentined, beginning at RF input 10 and RF output 40, respectively and terminating at a connection to interdigitated capacitor 130.

In FIG. 8, there is shown an equivalent circuit representation of the coplanar wave guide band stop filter of FIG. 7. The parallel combination of inductor 100 and capacitor 80 is coupled between RF input 10 and node 85. The parallel combination of inductor 110 and capacitor 90 is coupled between RF output 40 and node 85. RF input 10, node 85, and RF output 40 are also coupled through capacitors 120, 130, and 140, respectively, to electrical ground.

Conventional high attenuation stop-band filters require multiple tuned circuits and require more components and multiple capacitance-inductance ratios. In addition, the ability to control the tolerance of inductance and capacitance values is not practical unless adjustable components are made part of the design. The parasitic inductance and capacitance associated with the use of variable components also contributes to an impractical design. MIC or MMIC designs described herein exhibit desired high attenuation stop-band filter performance with fewer resonant circuits. This is because the inductive transmission lines 20 and 30 are designed for anti-resonance at harmonics and many undesired parasitics are eliminated. With fewer components and parasitics, insertion loss is less and tuning is predictable and repeatable.

In FIG. 9, there is shown a coplanar wave guide low pass filter in accordance with a preferred embodiment of the present invention. The layout is again basically rectangular, with a perimeter ground strip defining the rectangular outline and RF input 10 and RF output 40 protruding through gaps in opposite sides of the rectangular ground strip outline. Capacitors 150 and 180 are interdigitated capacitors adjacent to RF input 10 and RF output 40, respectively. Transmission line 160 is serpentined, beginning at RF input 10 and ending at RF output 40.

In FIG. 10, there is shown an equivalent circuit representation of the coplanar wave guide low pass filter of FIG. 9. Inductor 160 is coupled between RF input 10 and RF output 40. RF input 10 is coupled through capacitor 150 to electrical ground and RF output 40 is coupled through capacitor 180 to electrical ground.

In summary, with the filter configurations described, more efficient use of substrate area is realized for all filters, which also exhibit superior performance when compared to conventional transmission line or lumped element filters. As has been described, the filters above are much smaller than conventional filters because MIC and MMIC component geometry allows the use of fewer components with physically smaller mechanical dimensions to achieve required values of capacitance and inductance. These same component values have inherently precise electrical tolerances because metalization can be well controlled in both processes.

The preferred embodiments in accordance with the present invention, as necessary, employ at least bilaterally symmetric designs and shortened, precision capacitor loaded resonators and precision capacitor coupling between resonators. Such designs fractionalize overall layout area for a typical low frequency MIC or MMIC microwave filter intended for use at low microwave cellular telephone frequency (800 MHz) applications. For example, the standard filter design approach is to use distributed coupling between resonators, which consumes up to ten times the required layout area. By using precision capacitive coupling between shortened resonators as in the band pass filter, band pass characteristics Of a filter are easily controlled, without critical resonator spacing. Coupling between resonators can be adjusted without redesign of resonator spacing.

Applications of the present disclosure will be especially useful in current and future applications that require maximum filter performance at a lower cost within an allotted circuit area, particularly in MMIC applications where the cost is directly proportionate to substrate area. The examples shown are appropriate for receivers and transmitters, such as cellular telephones, portable telephones, pagers, portable location equipment and other wireless devices, including garage door openers, toys etc.

Thus, transmission line filters for MIC and MMIC applications have been described which overcomes specific problems and accomplishes certain advantages relative to prior art methods and mechanisms. The improvements over known technology are significant. In addition to cost reduction, the filters described and documented within this disclosure solve the following design problems associated with contemporary filter designs:

Excessive component volume and area resulting from the use of conventional components and fabrication techniques;

Excessive component losses which are proportionate to the selection of inductor size or transmission line length and width; and Tuning inaccuracy resulting from the use of non-precision capacitor and inductor fabrication.

There have also been provided transmission line filters for MIC and MMIC applications that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A transmission line filter for MIC and MMIC applications comprises:

first and second transmission lines, each including a first end and a second end, wherein the first and second transmission lines are substantially parallel, the first end of the first transmission line is adjacent to the first end of the second transmission line, and the second end of the first transmission line and the first end of the second transmission line are both coupled to an electrical ground;

a RF input for inputting a RF signal coupled to the first transmission line;

a first capacitor coupled in series between the first end of the first transmission line and the electrical ground;

a second capacitor coupled in series between the second end of the second transmission line and the electrical ground;

a third capacitor coupled between the first and second transmission lines; and a RF output coupled to the second transmission line, the RF output for outputting a filtered RF signal in response to the RF signal.

2. A transmission line filter as claimed in claim 1, wherein the third capacitor is centered between the first and second ends of the first and second transmission lines.

3. A transmission line filter as claimed in claim 1, wherein a length L of each of the first and second transmission lines is $L=\lambda_g/2\pi(\tan^{-1}(1/\omega CZ_o))$, where C is a capacitance of each of the first and the second capacitors and $Z_o$ is a characteristic impedance of each of the first and the second transmission lines.

4. A transmission line filter as claimed in claim 1, wherein each of the first and the second capacitors comprises a MIC interdigitated capacitor.

5. A transmission line filter as claimed in claim 1, wherein each of the first and the second capacitors comprises a MMIC interdigitated capacitor.

6. A transmission line filter as claimed in claim 1, wherein each of the first and the second transmission lines are coplanar.

7. A transmission line filter as claimed in claim 4, wherein each of the first and the second transmission lines comprises a "U" shaped section from which interdigitated portions form the third capacitor.

8. A wave guide band pass filter comprising:

a perimeter ground strip;

a coupling capacitor connected between a RF input and a RF output by first and second serpentine wave guides, respectively, wherein the RF input and the RF output protrude through gaps on opposite sides of the perimeter ground strip;

a first interdigitated capacitor coupled between the RF input and the perimeter ground strip; and a second interdigitated capacitor coupled between the RF output and the perimeter ground strip, wherein the wave guide band pass filter produces a pass band at the RF output from a RF signal input to the RF input.

9. A wave guide band pass filter as claimed in claim 8, wherein the first and the second serpentine wave guides, the coupling capacitor, and the first and second interdigitated capacitors are all coplanar.

10. A wave guide band pass filter as claimed in claim 8, wherein the perimeter ground strip is substantially rectangular, the coupling capacitor is centered within an area defined by the perimeter ground strip, and the first and the second serpentine wave guides are each of substantially identical length.

11. A wave guide band pass filter as claimed in claim 8, wherein the perimeter ground strip, the coupling capacitor, the first interdigitated capacitor, and the second interdigitated capacitor comprise a MMIC.

12. A wave guide band stop filter comprising:

a perimeter ground strip;

a serpentine wave guide coupled between a RF input and a RF output, wherein the RF input and the RF output protrude through gaps on opposite sides of the perimeter ground strip;

a first interdigitated capacitor coupled between the RF input and the perimeter ground strip;

a second interdigitated capacitor coupled between the RF output and the perimeter ground strip; and a third interdigitated capacitor having a first side and a second side, wherein the first side is coupled to the RF input, to the RF output, and to a midpoint of the serpentine wave guide and the second side is coupled to the perimeter ground strip, wherein the wave guide band stop filter excludes a stop band at the RF output from a RF signal input to the RF input.

13. A wave guide band stop filter as claimed in claim 12, wherein the serpentine wave guide, the first, the second, and the third interdigitated capacitors and the perimeter ground strip are all coplanar.

14. A wave guide band stop filter as claimed in claim 12, wherein the perimeter ground strip is substantially rectangular.

15. A wave guide band stop filter as claimed in claim 12, further comprising a fourth capacitor coupled between the RF input and the first side of the third interdigitated capacitor and a fifth capacitor coupled between the RF output and the third interdigitated capacitor.

16. A wave guide band stop filter as claimed in claim 12, wherein the perimeter ground strip, the serpentine wave guide, the first interdigitated capacitor, the second interdigitated capacitor, and the third interdigitated capacitor comprise a MMIC.

17. A wave guide low pass filter comprising:

a perimeter ground strip;

a serpentine wave guide coupled between a RF input and a RF output, wherein the RF input and the RF output protrude through gaps on opposite sides of the perimeter ground strip;

a first interdigitated capacitor coupled between the RF input and the perimeter ground strip; and a second interdigitated capacitor coupled between the RF output and the perimeter ground strip, wherein the wave guide low pass filter excludes higher frequencies at the RF output from a RF signal input to the RF input.

18. A wave guide low pass filter as claimed in claim 17, wherein the serpentine wave guide, the first and the second interdigitated capacitors and the perimeter ground strip are all coplanar.

19. A wave guide low pass filter as claimed in claim 17, wherein the perimeter ground strip is substantially rectangular and the serpentine wave guide is bilaterally symmetric about a midpoint.

20. A wave guide band stop filter as claimed in claim 17, wherein the perimeter ground strip, the serpentine wave guide, the first interdigitated capacitor, and the second interdigitated capacitor comprise a MMIC.

* * * * *